United States Patent
Hoogboom et al.

(10) Patent No.: US 12,024,693 B2
(45) Date of Patent: Jul. 2, 2024

(54) IMIDAZOLIDINETHIONE-CONTAINING COMPOSITIONS FOR POST-ASH RESIDUE REMOVAL AND/OR FOR OXIDATIVE ETCHING OF A LAYER OR MASK COMPRISING TiN

(71) Applicant: BASF SE, Ludwigshafen am Rhein (DE)

(72) Inventors: Joannes Theodorus Valentinus Hoogboom, Ludwigshafen (DE); Andreas Klipp, Ludwigshafen (DE); Jhih Jheng Ke, Taoyuan (TW); Yi Ping Cheng, Taoyuan (TW)

(73) Assignee: BASF SE, Ludwigshafen am Rhein (DE)

( * ) Notice: Subject to any disclaimer, the term of this patent is extended or adjusted under 35 U.S.C. 154(b) by 792 days.

(21) Appl. No.: 17/044,989

(22) PCT Filed: Mar. 25, 2019

(86) PCT No.: PCT/EP2019/057377
§ 371 (c)(1),
(2) Date: Oct. 2, 2020

(87) PCT Pub. No.: WO2019/192866
PCT Pub. Date: Oct. 10, 2019

(65) Prior Publication Data
US 2021/0189298 A1    Jun. 24, 2021

(30) Foreign Application Priority Data

Apr. 4, 2018    (EP) .................................... 18165775

(51) Int. Cl.
| | | |
|---|---|---|
| C09K 13/00 | (2006.01) | |
| C11D 7/26 | (2006.01) | |
| C11D 7/32 | (2006.01) | |
| C11D 7/34 | (2006.01) | |
| C11D 7/50 | (2006.01) | |
| G03F 7/42 | (2006.01) | |

(52) U.S. Cl.
CPC .............. *C11D 7/34* (2013.01); *C09K 13/00* (2013.01); *C11D 7/263* (2013.01); *C11D 7/3281* (2013.01); *C11D 7/5009* (2013.01); *G03F 7/426* (2013.01); *C11D 2111/22* (2024.01)

(58) Field of Classification Search
None
See application file for complete search history.

(56) References Cited

U.S. PATENT DOCUMENTS

| | | | |
|---|---|---|---|
| 6,696,222 B2 | 2/2004 | Hsue et al. | |
| 7,541,322 B2 | 6/2009 | Ikemoto et al. | |
| 10,170,296 B2 | 1/2019 | Ke et al. | |
| 2001/0014534 A1 | 8/2001 | Aoki et al. | |
| 2005/0020463 A1 | 1/2005 | Ikemoto et al. | |
| 2009/0215269 A1* | 8/2009 | Boggs | C09G 1/02 438/692 |
| 2009/0215658 A1 | 8/2009 | Minsek et al. | |
| 2010/0163788 A1 | 7/2010 | Visintin et al. | |
| 2011/0186086 A1 | 8/2011 | Minsek et al. | |
| 2013/0217234 A1 | 8/2013 | Liu et al. | |
| 2015/0000697 A1 | 1/2015 | Minsek et al. | |
| 2015/0344825 A1* | 12/2015 | Cooper | C11D 7/26 510/175 |
| 2016/0032186 A1* | 2/2016 | Chen | G03F 7/423 252/79.3 |
| 2017/0076939 A1 | 3/2017 | Ke et al. | |
| 2017/0200601 A1 | 7/2017 | Song et al. | |
| 2018/0204764 A1* | 7/2018 | Cooper | G03F 7/425 |

(Continued)

FOREIGN PATENT DOCUMENTS

| | | |
|---|---|---|
| CN | 1918698 A | 2/2007 |
| JP | 2001209191 A | 8/2001 |

(Continued)

OTHER PUBLICATIONS

International Search Report dated Jul. 11, 2019 in PCT/EP2019/057377 filed Mar. 25, 2019.

*Primary Examiner* — Allan W. Olsen
(74) *Attorney, Agent, or Firm* — Armstrong Teasdale LLP

(57) ABSTRACT

Described herein is a cleaning composition for post-etch or post-ash residue removal from the surface of a semiconductor substrate and a corresponding use of said cleaning composition. Further described is the use of said cleaning composition in combination with one or more oxidants, e.g. for oxidative etching or partial oxidative etching of a layer or mask, comprising or consisting of TiN, preferably in the presence of a tungsten material, on the surface of a semiconductor substrate, and/or for post-etch or post-ash residue removal from the surface of a semiconductor substrate. Moreover, it is described a wet-etch composition comprising the cleaning composition of the present invention and one or more oxidants, the use of said wet-etch composition for oxidative etching or partial oxidative etching of a layer or mask, comprising or consisting of TiN, preferably in the presence of a tungsten material, on the surface of a semiconductor substrate, and/or for post-etch or post-ash residue removal from the surface of a semiconductor substrate, a process for the manufacture of a semiconductor device from a semiconductor substrate using said wet-etch composition and a kit comprising the cleaning composition of the present invention and one or more oxidants. Furthermore, it is described the use of an imidazolidinethione in a composition for etching or partially etching of a layer or mask on the surface of a semiconductor substrate and/or for cleaning a semiconductor substrate.

15 Claims, No Drawings

(56) References Cited

U.S. PATENT DOCUMENTS

2019/0136161 A1* 5/2019 Kamimura ............... C11D 7/26
2019/0177670 A1* 6/2019 Kamimura .......... H01L 21/3065

FOREIGN PATENT DOCUMENTS

| JP | 2003289060 A | 10/2003 |
| --- | --- | --- |
| JP | 201174189 A | 4/2011 |
| TW | 201602339 A | 1/2016 |
| TW | 201723166 A | 7/2017 |
| WO | WO 2005/098920 A2 | 10/2005 |
| WO | WO 2007/044446 A1 | 4/2007 |
| WO | WO 2008/080097 A2 | 7/2008 |
| WO | 2014197808 A1 | 12/2014 |
| WO | WO 2015/173730 A1 | 11/2015 |
| WO | WO 2016/042408 A2 | 3/2016 |

* cited by examiner

IMIDAZOLIDINETHIONE-CONTAINING COMPOSITIONS FOR POST-ASH RESIDUE REMOVAL AND/OR FOR OXIDATIVE ETCHING OF A LAYER OR MASK COMPRISING TiN

The present invention relates to a cleaning composition for post-etch or post-ash residue removal from the surface of a semiconductor substrate and to a corresponding use of said cleaning composition. The present invention further relates to the use of said cleaning composition in combination with one or more oxidants, e.g. for oxidative etching or partial oxidative etching of a layer or mask, comprising or consisting of TiN, preferably in the presence of a tungsten material, on the surface of a semiconductor substrate and/or for post-etch or post-ash residue removal from the surface of a semiconductor substrate. Moreover, the present invention pertains to a wet-etch composition comprising the cleaning composition of the present invention and one or more oxidants, to the use of said wet-etch composition for oxidative etching or partial oxidative etching of a layer or mask, comprising or consisting of TiN, preferably in the presence of a tungsten material, on the surface of a semiconductor substrate, and/or for post-etch or post-ash residue removal from the surface of a semiconductor substrate, to a process for the manufacture of a semiconductor device from a semiconductor substrate using said wet-etch composition and to a kit comprising the cleaning composition of the present invention and one or more oxidants. The present invention also relates to the use of an imidazolidinethione in a composition for etching or partially etching of a layer or mask on the surface of a semiconductor substrate and/or for cleaning a semiconductor substrate.

Processes for manufacturing semiconductor devices are multiple-step sequences of photolithographic and chemical processing steps during which electronic circuits are gradually created on a wafer made of pure semiconducting material (a "semiconductor wafer"). Preferably, silicon is used as the semiconductor material. A typical semiconductor wafer is made out of extremely pure silicon that is grown into mono-crystalline cylindrical ingots (boules) up to 300 mm in diameter using the so-called "Czochralski process". These ingots are then sliced into wafers about 0.75 mm thick and polished to obtain a very regular and flat surface. The particular process for manufacturing semiconductor wafers is structured in several phases, comprising e.g. the so-called "front-end-of-line" ("FEOL") and "back-end-of-line" ("BEOL") processing phases.

The FEOL processing phase refers to the formation of transistors directly in the material (usually the silicon) of the semiconductor wafer. The raw semiconductor wafer is engineered by the growth of an ultrapure, virtually defect-free silicon layer through epitaxy. Front-end surface engineering is followed by growth of the gate dielectric (usually silicon dioxide), patterning of the gate, patterning of the source and drain regions, and subsequent implantation or diffusion of dopants into the semiconducting material to obtain the desired complementary electrical properties.

Once the various devices (e.g. dynamic random access memories, DRAMs; static random access memories, SRAMs; electrically programmable read only memories, EPROMs; or complementary metal on silicon, CMOS) have been created in FEOL processing, they must be interconnected to form the desired electrical circuits. This occurs in a series of wafer processing steps collectively referred to as BEOL. The BEOL processing phase involves creating metal interconnecting wires on the semiconductor wafer's surface that are isolated by layers made of material with low dielectric constant.

With the introduction of copper as electrically conductive material, replacing aluminium, sophisticated multiple-step manufacturing processes for forming integrated circuit interconnects on semiconductor substrates have been developed. A typical process in manufacturing the semiconductor integrated circuit requires hundreds of steps. These steps include several kinds of stages such as diffusion, lithography, etching, ion implantation, deposition and sputtering.

One particular multiple-step manufacturing process for forming integrated circuit interconnects on semiconductor substrates is known as damascene process with its variants like the dual damascene process, including the TFVL ("trench-first-via-last") dual damascene process, the VFTL ("via-first-trench-last") dual damascene process, the self-aligned dual damascene process or the dual damascene patterning process with etch mask, e.g. with metal hard mask (for the latter see e.g. document U.S. Pat. No. 6,696,222). In the damascene processing technology, the desired integrated circuit interconnect structure is patterned by etching the shape of the structure into the underlying inter-layer dielectric ("ILD") materials. After the patterning, typically a thin barrier layer (e.g. made of Ta/TaN, TiN, CoWP, NiMoP, NiMoB) is deposited on top of the etched structure, e.g. as copper diffusion barrier. On top of that barrier layer a seed layer is often deposited which supports better adhesion of the copper on the underlying material and acts as catalytic material during the plating process as well. Typical materials for these seed layers are compounds which include Pd or other compounds, e.g. of polymers and organic materials. The original deposition process (damascene process) was designed to process each layer on its own.

Hence, the so called "vertical interconnect accesses" ("Vias"), the electrically conductive interconnects usually comprising or consisting of copper, and the overlying metallization levels have different process steps and demand a sequence of cleaning, material deposition, chemical-mechanical polishing ("CMP"), and another cleaning step for each layer. A copper technology using this sequence for its metallization levels as well as for its ILDs and inter via dielectrics ("IVD"s) is often called a "single damascene process". Typically, in the single damascene process each level requires its own cap layer or etch stop layer, a separate ILD layer, and at the top there is a need for a material—for instance $SiO_2$— that can be polished together with the interconnect metal copper. As an alternative to the single damascene process, the "dual damascene" processing technology combines certain similar process steps to one single process step, thus reducing the number of process steps and the time and costs required to build the BEOL stack of different layers. Accordingly, the dual damascene process fabricates the IVD and the metallization layer at once.

Multiple-step manufacturing processes for forming integrated circuit interconnects on semiconductor substrates like the damascene manufacturing process or its variants thus usually comprise one or more process steps which require an "opening" of the Vias, usually by applying a dry etching technology like reactive ion etching ("RIE") or plasma etching (also known as chemical dry etching), which involve reactive etching gases promoted with plasma energy.

Such Via-opening process steps usually comprise etching of one or more different (consecutive) layers situated above the Vias, which layers may comprise electrically conductive, electrically semi-conductive and/or insulating materials. Examples of such different (consecutive) layers are photoresist layers, bottom anti-reflective coating (BARC) layers, etch mask layers (e.g. metal hard mask layers, preferably comprising TiN, or polymer mask layers), ILD layers (e.g. comprising $SiO_2$ or silicon oxynitride) or low k material layers. Etching of said different layers is usually performed selectively (often by applying one or more etch mask layers to protect areas of a layer which should not be etched in a particular etching step) over a part of their horizontal extensions to create defined openings for accessing certain areas of one or more subjacent layers, until a defined segment of the Via is reached at the bottom of the stack of layers.

In certain multiple-step manufacturing processes for forming integrated circuit interconnects on semiconductor substrates, etch masks like metal hard masks, e.g. TiN hard masks, need to be removed or partially removed. This removal or partial removal of an etch mask should be done with a high selectivity for the material to be removed, in order to preserve any other structures present on the semiconductor substrate's surface. TiN is e.g. often used as a RIE hard mask to achieve improved selectivity to low k materials in copper dual damascene device fabrication, in particular for the 32 nm node and beyond. However, a disadvantage with this approach is that an overhang mask is sometimes produced, e.g. after RIE, which could result in voids in the subsequent deposition steps of barrier metal, copper seed layer and copper filling. Therefore, it is sometimes beneficial to etch the TiN mask in such a way as to form a pullback/rounded corner morphology to eliminate mask overhang and ensure reliable metal deposition or to selectively remove or to partially remove a layer or mask, comprising or consisting of TiN. Such a process, where a layer or mask, comprising or consisting of TiN, is selectively partially removed and/or selectively partially oxidatively etched and/or selectively recessed and/or selectively pulled back is often referred to as a "TiN pullback process". Such a TiN pullback process can e.g. remove a part of the layer or mask, comprising or consisting of TiN, and thus partially expose the material of the next layer which is underneath the layer or mask comprising or consisting of TiN.

Depending on the particular structure of the integrated circuit interconnects that need to be created on a given semiconductor substrate, the above-stated removal or partial removal of a TiN hardmask may need to be selectively performed with high precision in the presence of other materials, in particular in the presence of a tungsten material and/or a low-k material. In these cases, when removing or partially removing the layer or mask comprising or consisting of TiN the other materials present, in particular a tungsten material and/or a low-k material, must not be affected or damaged or only be affected or damaged to the least possible extent.

The above-stated etching processes produce residues from the interaction of the etching media used in the etching process and the materials they interact with. The composition of said residues is influenced by the type of etching applied, the material of the layer etched (e.g. the resist), any underlying substrates and the process conditions applied.

Types of residues that should be removed often comprise organic compounds like organic polymers which may or may not comprise fluorine and/or—in particular in cases where layers or masks like etch-stop layers and/or hard masks, more in particular etch stop layers and/or hard masks comprising or consisting of TiN, were etched—also metal-organic complexes, preferably selected from the group consisting of complexes of titanium (Ti, comprising fluorine complexes of Ti, also referred to as "$TiF_x$", and oxygen complexes of Ti, also referred to as "$TiO_x$") and of Cu and/or residues comprising metallic materials, preferably selected from the group consisting of Al, AlCu (i.e. an alloy of Al and Cu), $HfO_x$ (i.e. hafnium oxide) Ta, TaN, Ti, an oxide of titanium and a nitride of titanium, more preferably selected from the group consisting of Ti, an oxide of titanium and a nitride of titanium. Post-etch or post-ash residues of the organic polymer type may e.g. originate from the etching or processing of one or more different layers on the semiconductor substrate, e.g. from photoresist layers, bottom anti-reflective coating layers, ILD layers and/or low k material layers.

If the etching residues are not removed from the substrate, they can interfere with subsequent processes involving the substrate. Such removal of or cleaning from etching residues is often referred to as "post-etch residue" removal or as "post-ash residue" removal. The effect of poor removal or cleaning can result in low yield, low reliability and/or low performance of an affected semiconductor device. Inappropriate cleaning can also lead to unsatisfactory short times during which a semiconductor wafer's surface during processing can be exposed to air without experiencing degradation of quality of the deposited film, resulting in queue time constraints and thus in a limitation of process flexibility.

The ongoing development in manufacturing processes for forming integrated circuit interconnects on semiconductor substrates (e.g. shrinking device dimensions, changes in etching conditions) and the ongoing integration of new materials in said processes demand specialized cleaning compositions to meet these changing requirements. The prior art also reflects this versatility of requirements:

For example, document WO 2005/098920 A2 deals with an aqueous solution for removing post-etch residue.

Document WO 2015/173730 A1 refers to tin pull-back and cleaning composition.

Related art is also:

Document WO 2016/042408 A2 pertains to compositions for etching titanium nitride having compatibility with silicon germanide and tungsten.

Document WO 2008/080097 A2 deals with a liquid cleaner for the removal of post-etch residues.

Document WO 2007/044446 A1 describes an oxidizing aqueous cleaner for the removal of post-etch residues.

Document US 2013/217234 A1 refers to a cleaning solution and a damascene process using the same.

In view of the prior art there is still a need for a cleaning composition for post-etch or post ash residue removal from a substrate used in semiconductor industry which can satisfactorily remove post-etch or post-ash residues from one or more different layers (i.e. from layers which have been etched before), e.g. photoresist layers, bottom antireflective coating layers, ILD layers and/or low k material layers, while at the same time not or to the least extent possible compromising or damaging low k materials and/or metallic interconnect materials, in particular tungsten and/or copper, which are also present.

There is also still a need for a wet-etch composition for oxidative etching or partial oxidative etching of a layer or mask, comprising or consisting of TiN, preferably in the presence of a tungsten material and/or a low-k material, on the surface of a semiconductor substrate and/or for removing post-etch or post-ash residue from the surface of a semiconductor substrate. Similarly, there is still a need for a process for the manufacture of a semiconductor device from a semiconductor substrate which allows for oxidative etching or partial oxidative etching of a layer or mask, comprising or consisting of TiN, preferably in the presence of a tungsten material and/or a low-k material, on the surface of a semiconductor substrate, and/or for removing post-etch or post-ash residue from the surface of a semiconductor substrate.

In particular, a composition is desirable which combines the above-stated functions of selectively partially removing and/or selectively partially oxidatively etching and/or selectively recessing and/or selectively pulling back a layer or mask, comprising or consisting of TiN and of removing post-etch or post ash residue from the surface of a semiconductor substrate, while not or to the least extent possible compromising or damaging metallic interconnect materials, in particular tungsten, and/or low k materials which are also present on the substrate It was therefore an object of the present invention to provide an improved cleaning composition for post-etch or post ash residue removal from a semiconductor substrate for removing residues from one or more different layers (which can be present on the substrate at the same time; i.e. from layers which have been etched before) e.g. selected from photoresist layers, bottom antireflective coating layers, etch mask layers, ILD layers and low k material layers, while at the same time not or to the least extent possible compromising or damaging low k materials and/or metallic interconnect materials, in particular tungsten, which are also present on the substrate.

It was a primary object of the present invention to provide an improved wet-etch composition for oxidative etching or partial oxidative etching of a layer or mask, comprising or consisting of TiN, preferably in the presence of a tungsten material and/or a low-k material, on the surface of a semiconductor substrate, and/or for post-etch or post-ash residue removal from the surface of a semiconductor substrate.

It was another object of the present invention to provide an improved process for the manufacture of a semiconductor device from a semiconductor substrate, where the process allows for oxidative etching or partial oxidative etching of a layer or mask, comprising or consisting of TiN, preferably in the presence of a tungsten material, on the surface of a semiconductor substrate, and/or a low-k material, and/or for removing post-etch or post-ash residue from the surface of a semiconductor substrate.

It was a more specific object of the present invention to provide a kit, in particular for use in an improved process for the manufacture of a semiconductor device from a semiconductor substrate.

It was still another object of the present invention to provide a composition for etching or partially etching of a layer or mask in the presence of a tungsten material and/or a low-k material on the surface of a semiconductor substrate and/or for post-etch or post-ash residue removal from the surface of a semiconductor substrate, with improved protective properties for a tungsten material.

It has now surprisingly been found that the primary object and other objects of the invention are accomplished by a cleaning composition for post-etch or post-ash residue removal from the surface of a semiconductor substrate, comprising (i.e. the cleaning composition of the present invention may contain further components in addition to components (A) to (E) as defined below) or consisting of (i.e. the cleaning composition of the present invention may not contain further components in addition to components (A) to (E) as defined below):

(A) one or more sulfonic acids, selected from the group consisting of methane sulfonic acid, ethanesulfonic acid, propanesulfonic acid, butanesulfonic acid, hexanesulfonic acid, 3-(N-morpholino)propane sulfonic acid, 2-(N-morpholino)ethanesulfonic acid, N-cyclohexyl-2-aminoethanesulfonic acid, 3-[4-(2-hydroxyethyl)-1-piperazinyl]propanesulfonic acid, N-cyclohexyl-3-aminopropanesulfonic acid and mixtures thereof; preferably the or at least one sulfonic acid is methane sulfonic acid;

(B) one or more polar, non-protogenic organic solvents selected from the group consisting of dimethyl formamide, dimethyl sulfoxide, dimethylacetamide, N-methylpyrrolidone, propylene carbonate, sulfolane, tetrahydrofuran and mixtures thereof; preferably the or at least one polar, non-protogenic organic solvent is sulfolane;

(C) one or more glycol ethers selected from the group consisting of 1,1-dimethoxyethane, 1-methoxy-2-butanol, 2-(2-butoxyethoxy) ethanol, 2-(naphthalene-6-yloxy)polyethoxyethanol, 2-(hexyloxy)ethanol, 2-methoxy-1-butanol, 2-methoxy-2-methylbutanol, butyl diglycol, diethylene glycol diethyl ether, diethylene glycol dimethyl ether, diethylene glycol methyl ethyl ether, diethylene glycol monobenzyl ether, diethylene glycol monobutyl ether, diethylene glycol monoethyl ether, diethylene glycol monoisobutyl ether, diethylene glycol monoisopropyl ether, diethylene glycol monomethyl ether, diethylene glycol monopropyl ether, dipropylene glycol diisopropyl ether, dipropylene glycol monoisopropyl ether, dipropylene glycol monomethyl ether, dipropylene glycol monopropyl ether, dipropylenemonobutyl ether, ethylene glycol diethyl ether, ethylene glycol dimethyl ether, ethylene glycol monobutyl ether, ethylene glycol monoethyl ether acetate, ethylene glycol monoethyl ether, ethylene glycol monomethyl ether, monopropyl ether, polyethylene glycol monomethyl ether, propylene glycol dimethyl ether, propylene glycol monobutyl ether, propylene glycol monomethyl ether, propylene glycol, tetrahydrofurfurylalcohol, triethylene glycol dimethyl ether, triethylene glycol ethylene glycol monomethyl ether acetate, triethylene glycol monomethyl ether, tripropylene glycol monomethyl ether and mixtures thereof; preferably the or at least one glycol ether is dibutyl glycol;

(D) one or more imidazolidinethiones, preferably selected from the group consisting of 2-imidazolidinethione, 2,3,5-triphenyl-4-imidazolidinethione, 4-methyl-2-imidazolidinethione and 1-methyl-3-propyl-2-imidazolidinethione and mixtures thereof; more preferably the or at least one imidazolidinethione is 2-imidazolidinethione;

and (E) water.

The invention as well as preferred embodiments and preferred combinations of parameters, properties and elements thereof are defined in the appended claims. Preferred aspects, details, modifications and advantages of the present invention are also defined and explained in the following description and in the examples stated below.

In the context of the present invention, a "photoresist layer" means—consistent with the usual meaning in the technical field of microelectronics or microlithography—a layer or film which, when exposed to light with a wavelength in the range of from 250 to 400 nm, the portion of the photoresist that was exposed to said light either becomes (i) soluble to a specific developer ("positive photoresist") while the unexposed portion of the photoresist remains insoluble to the photoresist developer, or the portion of the photoresist that was exposed to said light becomes (ii) insoluble to a specific developer ("negative photoresist") while the unexposed portion of the photoresist remains soluble to the photoresist developer. The term "photoresist" in the context of the present invention comprises photopolymeric photoresists, photodecomposable photoresists and photocrosslinking photoresists.

In the context of the present invention, a "bottom anti-reflective coating" ("BARC") or bottom resist anti-reflective coating means—consistent with the usual meaning in the technical field of microelectronics or microlithography—an organic or silico-organic polymer used to improve the profile of a photoresist and the overall process operating window. BARCs are applied prior to the photoresist to help eliminate standing waves and the resulting defective/sloped resist sidewalls, which can commonly occur in imaged nanostructures due to varying and reflected light intensities throughout the resist thickness. BARCS have to be selected based on the specific wavelength processes including i-Line, 248 nm, 193 nm (dry and immersion). They also have to be compatible with the applied photoresist. BARCs are applied to a semiconductor substrate from organic polymer formulations using a spin-on process and are then heated ("baked", "cured") to a recommended temperature.

In the context of the present invention an "etch mask" means—consistent with the usual meaning in the technical field of microelectronics or microlithography—a layer of a material that can withstand certain etching process steps undamaged and therefore serves as a protecting layer for certain areas of subjacent material layers which should not be etched in such certain etching step. An etch mask can subsequently be selectively removed under conditions specific to the etch mask material while the subjacent material layers are not (or only to a very little extent) affected, so that these are exposed for further processing. In the context of the present invention, an etch mask layer preferably comprises or consists of (a) a material selected from the group consisting of Ti, TiN, La, LaN, $HfO_x$ (i.e. hafnium oxide), Al, AlCu, preferably comprising or consisting of TiN, or (b) an organic polymeric material. An etch mask can also be a photoresist.

In the context of the present invention an "ILD" means—consistent with the usual meaning in the technical field of microelectronics or microlithography—a dielectric material used to electrically separate closely spaced interconnect lines arranged in several levels (multilevel metallization) in an integrated circuit. An ILD usually has a dielectric constant k≤3.9 to minimize capacitive coupling between adjacent metal lines, e.g. Vias. In the context of the present invention, an ILDs preferably comprises or consists of $SiO_2$ and/or silicon oxynitride.

In the context of the present invention a "low k material" means—consistent with the usual meaning in the technical field of microelectronics or microlithography—a material with a dielectric constant κ<3.9 which is preferably selected from the group consisting of silicon-containing materials, preferably selected from the group consisting of $SiO_2$, silicon oxycarbide (SiOC), tetraethylorthosilicate (TEOS), boron-doped phosphosilicate glass (BPSG), fluorine-doped silicon dioxide (fluorosilicate glass, FSG), carbon-doped silicon dioxide, organo silicate glass (OSG), carbon-doped oxide (CDO), porous silicon dioxide, porous carbon-doped silicon dioxide (e.g. known as Black Diamond™ II) and spin-on silicon polymeric materials, preferably selected from the group consisting of hydrogen silsesquioxane (HSQ) and methylsilsesquioxane (MSQ); and polymeric materials, preferably selected from the group consisting of spin-on organic polymeric dielectrics, preferably comprising polyimide (PI), polynorbornenes, benzocyclobutene and polytetrafluorethylene (PTFE).

In the context of the present invention a "metallic interconnect material" means—consistent with the usual meaning in the technical field of microelectronics or microlithography—a material selected from the group consisting of aluminium, cobalt, copper, ruthenium, titanium and tungsten, preferably copper and/or tungsten.

In the context of the present invention a "substrate used in semiconductor industry" or a "semiconductor substrate" preferably mean—consistent with the usual meaning in the technical field of microelectronics or microlithography—a semiconductor wafer.

In the context of the present invention "protogenic" means—consistent with the usual meaning in the technical field of chemistry—capable of acting as a proton donor, in particular towards water.

In the context of the present invention "metal-organic complexes" preferably means complexes selected from the group consisting of complexes of Ti (comprising fluorine complexes of Ti, also referred to as "$TiF_x$", and oxygen complexes of Ti, also referred to as "$TiO_x$") and of Cu.

In the context of the present invention "metallic materials" preferably means materials selected from the group consisting of Al, AlCu (i.e. an alloy of Al and Cu), $HfO_x$ (i.e. hafnium oxide) Ta, TaN, titanium (Ti), an oxide of titanium and a nitride of titanium, more preferably selected from the group consisting of titanium (Ti), an oxide of titanium and a nitride of titanium.

In the cleaning composition according to the invention as defined above and in the wet-etch composition of the present invention as defined below, the one or more sulfonic acids (A), the one or more polar, non-protogenic organic solvents (B), the one or more glycol ethers (C) and the one or more imidazolidinethiones (D) generally can in each case be used alone (as one single compound) or can be used in combination with other compounds from the same type (sulfonic acids; polar, non-protogenic organic solvents; glycol ethers or imidazolidinethiones, respectively, as applicable).

Also preferred is a cleaning composition according to the invention as defined herein (or a cleaning composition according to the invention as described above or below as being preferred), which has a pH in the range of from 1 to 4, preferably in the range of from 1 to 3, more preferably in the range of from 1 to 2.

In alternatives of the present invention, the cleaning composition of the present invention may further comprise additional components. In some cases, a cleaning composition according to the invention as defined herein (or a cleaning composition according to the invention as described above or below as being preferred) is therefore preferred, which further (i.e. in addition to components (A) to (E) as defined above) comprises:

(F) one or more corrosion inhibitors selected from the group consisting of 2-oxazolidinones, preferably 2-oxazolidinone and 3-methyl-2-oxazolidone; imidazolidines; imidazolidinones, preferably 1-(2-hydroxyethyl)-2-imidazolidinone and 2-imidazolidinone; polyethyleneimines and polypropyleneimines.

Preferred for the purposes of the present invention are those 2-oxazolidinones which are disclosed on page 5 of document WO 2015/173730 A1. Preferred for the purposes of the present invention are those imidazolidines which are disclosed on pages 4 and 5 of document WO 2015/173730 A1. Preferred for the purposes of the present invention are those imidazolidinones which are disclosed on page 4 of document WO 2015/173730 A1.

More in particular, in the cases mentioned above (where the cleaning composition further comprises component (F)), a cleaning composition according to the invention is preferred wherein
 the or at least one corrosion inhibitor (F) is 2-imidazolidinone,
and/or
 the total amount of the one or more corrosion inhibitors (F), preferably of 2-imidazolidinone, is in the range of from 0.1 wt.-% to 10 wt.-%, preferably of from 0.5 wt.-% to 7.5 wt.-%, more preferably of from 0.75 wt.-% to 5 wt.-%, based on the total weight of the cleaning composition.

Preferred is also a cleaning composition according to the invention as defined herein (or a cleaning composition according to the invention as described above or below as being preferred), wherein
 the or at least one sulfonic acid (A) is methane sulfonic acid, preferably the at least one sulfonic acid (A) is methane sulfonic acid,
and/or (preferably "and")
 the total amount of the one or more sulfonic acids (A), preferably of methane sulfonic acid, is in the range of from 0.01 wt.-% to 10 wt.-%, preferably of from 0.05 wt.-% to 5 wt.-%, more preferably of from 0.1 wt.-% to 1 wt.-%, based on the total weight of the cleaning composition.

Where in the cleaning composition according to the present invention or in the wet-etch composition according to the present invention as defined below the or at least one sulfonic acid (A) is methane sulfonic acid, this can be combined with any of the other components or preferred components of the cleaning composition or their mixtures to result in a preferred cleaning composition or wet-etch composition of the present invention, i.e. any of the polar, non-protogenic organic solvents (B) or their mixtures, any of the glycol ethers (C) or their mixtures and/or any of the imidazolidinethiones (D) or their mixtures and/or (where applicable) any of the corrosion inhibitors (F).

A cleaning composition according to the invention as defined herein (or a cleaning composition according to the invention as described above or below as being preferred) is also preferred wherein
 the or at least one polar, non-protogenic organic solvent (B) is sulfolane (2,3,4,5-tetrahydrothiophene-1,1-dioxide; CAS RN 126-33-0), preferably the at least one polar, non-protogenic organic solvent (B) is sulfolane,
and/or (preferably "and")
 the total amount of the one or more polar, non-protogenic organic solvents (B), preferably of sulfolane, is in the range of from 1 wt.-% to 25 wt.-%, preferably of from 2.5 wt.-% to 25 wt.-%, more preferably of from 5 wt.-% to 15 wt.-%, based on the total weight of the cleaning composition.

Where in the cleaning composition according to the present invention or in the wet-etch composition according to the present invention as defined below the or at least one polar, non-protogenic organic solvent (B) is sulfolane, this can be combined with any of the other components or preferred components of the cleaning composition or their mixtures to result in a preferred cleaning composition or wet-etch composition of the present invention, i.e. any of the sulfonic acids (A) or their mixtures, any of the glycol ethers (C) or their mixtures and/or any of the imidazolidinethiones (D) or their mixtures and/or (where applicable) any of the corrosion inhibitors (F).

A cleaning composition according to the invention as defined herein (or a cleaning composition according to the invention as described above or below as being preferred) is also preferred wherein
 the or at least one glycol ether (C) is butyl diglycol, preferably the at least one glycol ether (C) is butyl diglycol,
and/or (preferably "and")
 the total amount of the one or more glycol ethers (C), preferably of butyl diglycol, is in the range of from 10 wt.-% to 50 wt.-%, preferably of from 15 wt.-% to 45 wt.-%, more preferably of from 20 wt.-% to 40 wt.-%, based on the total weight of the cleaning composition.

Where in the cleaning composition according to the present invention or in the wet-etch composition according to the present invention as defined below the or at least one glycol ether (C) is butyl diglycol, this can be combined with any of the other components or preferred components of the cleaning composition or their mixtures to result in a preferred cleaning composition or wet-etch composition of the present invention, i.e. any of the sulfonic acids (A) or their mixtures, any of the polar, non-protogenic organic solvents (B) or their mixtures and/or any of the imidazolidinethiones (D) or their mixtures and/or (where applicable) any of the corrosion inhibitors (F).

Furthermore, a cleaning composition according to the invention as defined herein (or a cleaning composition according to the invention as described above or below as being preferred) is also preferred wherein
 the or at least one imidazolidinethione (D) is 2-imidazolidinethione,
and/or (preferably "and")
 the total amount of the one or more imidazolidinethiones (D), preferably of 2-imidazolidinethione, is in the range of from 0.05 wt.-% to 10 wt.-%, preferably of from 0.1 wt.-% to 5 wt.-%, more preferably of from 0.5 wt.-% to 2 wt.-%, based on the total weight of the cleaning composition.

Where in the cleaning composition according to the present invention or in the wet-etch composition according to the present invention as defined below the or at least one imidazolidinethione (D) is 2-imidazolidinethione this can be combined with any of the other components or preferred components of the cleaning composition or their mixtures to result in a preferred cleaning composition or wet-etch composition of the present invention, i.e. any of the sulfonic acids (A) or their mixtures, any of the polar, non-protogenic organic solvents (B) or their mixtures and/or any of the glycol ethers (C) and/or (where applicable) any of the corrosion inhibitors (F).

Moreover, a cleaning composition according to the invention as defined herein (or a cleaning composition according to the invention as described above or below as being preferred) is particularly preferred, comprising or consisting of (preferably consisting of):
 (A) methane sulfonic acid, preferably in a total amount in the range of from 0.01 wt.-% to 10 wt.-%, preferably of from 0.05 wt.-% to 5 wt.-%, more preferably of from 0.1 wt.-% to 1 wt.-%, based on the total weight of the cleaning composition,
 (B) sulfolane, preferably in a total amount in the range of from 1 wt.-% to 25 wt.-%, preferably of from 2.5 wt.-% to 25 wt.-%, more preferably of from 5 wt.-% to 15 wt.-%, based on the total weight of the cleaning composition, (C) butyl diglycol, preferably in a total amount in the range of from 10 wt.-% to 50 wt.-%, preferably of from 15 wt.-% to 45 wt.-%, more preferably of from 20 wt.-% to 40 wt.-%, based on the total weight of the cleaning composition, (D) 2-imidazolidinethione, preferably in a total amount in the range of from 0.05 wt.-% to 10 wt.-%, preferably of from 0.1 wt.-% to 5 wt.-%, more preferably of from 0.5 wt.-% to 2 wt.-%, based on the total weight of the cleaning composition and (E) water, preferably as balance to a total of 100 wt.-% of the cleaning composition in each case, which preferably has a pH in the range of from 1 to 4, more preferably in the range of from 1 to 3 and still more preferably in the range of from 1 to 2.

Under a particularly preferred aspect of the present invention, the cleaning composition according to the invention (or a cleaning composition according to the invention as described above or below as being preferred) is suitable and intended for the preparation of a respective wet-etch composition according to the invention, as defined in more detail below.

The present invention also pertains to the use of a cleaning composition according to the invention as defined herein (or to the use of a cleaning composition according to the invention as described herein as being preferred):

for removing post-etch or post-ash residue from the surface of a semiconductor substrate, preferably comprising a tungsten material and/or a low-k material,
    wherein the post-etch or post-ash residue preferably comprises one or more organic compounds, preferably organic polymers, comprising or not comprising fluorine (preferably comprising fluorine), and/or for cleaning a semiconductor substrate, preferably the surface of a semiconductor substrate, comprising a tungsten material and/or a low-k material, preferably after a step of etching one or more substrate layers,
    wherein the one or more substrate layers which have been etched before are preferably selected from the group consisting of inter-layer dielectric layers and low-k material layers;

and/or for removing residues and contaminants from the surface of a semiconductor substrate comprising a tungsten material and/or a low-k material,
    wherein the residues and contaminants preferably comprise or consist of organic compounds, preferably organic polymers, comprising or not comprising fluorine (preferably comprising fluorine).

Generally, all aspects of the present invention discussed herein in the context of the cleaning composition according to the invention apply mutatis mutandis to the use of said cleaning composition according to the invention, as defined here above and below. And vice versa, all aspects of the present invention discussed herein in the context of the use of said cleaning composition according to the invention apply mutatis mutandis to the inventive cleaning composition.

The present invention also pertains to a first process for the manufacture of a semiconductor device from a semiconductor substrate, comprising the following steps:

providing a cleaning composition as defined above (or a cleaning composition as defined above as being preferred)

and contacting at least once with the cleaning composition so provided the surface of a semiconductor substrate, preferably comprising a tungsten material and/or a low-k material, preferably after a step of etching and/or ashing one or more substrate layers, so as to remove post-etch or post-ash residue from the surface of the semiconductor substrate,
    wherein the post-etch or post-ash residue preferably comprises one or more organic compounds, preferably organic polymers, comprising or not comprising fluorine (preferably comprising fluorine), and/or clean the semiconductor substrate, preferably the surface of the semiconductor substrate,
    wherein the one or more substrate layers which have been etched before are preferably selected from the group consisting of inter-layer dielectric layers and low-k material layers;

and preferably performing additional subsequent steps so as to receive a semiconductor device, more preferably a cleaned semiconductor device.

Generally, all aspects of the present invention discussed herein in the context of the cleaning composition according to the invention and the use of the cleaning composition according to the invention apply mutatis mutandis to the first process for the manufacture of a semiconductor device according to the invention, as defined here above and below. And vice versa, all aspects of the present invention discussed herein in the context of the first process for the manufacture of a semiconductor device mutatis mutandis to the inventive cleaning composition and the use of the cleaning composition according to the invention.

In a particularly preferred aspect, the present invention also pertains to the use of a cleaning composition according to the invention as defined herein (or to the use of a cleaning composition according to the invention as described herein as being preferred) in combination with one or more oxidants:

for oxidative etching or partially oxidative etching of a layer or mask, comprising or consisting of TiN, preferably in the presence of a tungsten material and/or a low-k material, on the surface of a semiconductor substrate;

and/or for removing or partially removing a layer or mask, comprising or consisting of TiN, preferably in the presence of a tungsten material and/or a low-k material, on the surface of a semiconductor substrate;

and/or for recessing a layer or mask, comprising or consisting of TiN, preferably in the presence of a tungsten material and/or a low-k material, on the surface of a semiconductor substrate;

and/or for pulling back a layer or mask, comprising or consisting of TiN, preferably in the presence of a tungsten material and/or a low-k material, on the surface of a semiconductor substrate;

and/or
for removing post-etch or post-ash residue from the surface of a semiconductor substrate, preferably comprising a tungsten material and/or a low-k material,
wherein the post-etch or post-ash residue preferably comprises one or more residues selected from the group comprising or consisting of:
organic compounds, preferably organic polymers, comprising or not comprising fluorine (preferably comprising fluorine),
metal organic complexes and
metallic materials, preferably titanium and/or an oxide of titanium and/or a nitride of titanium,
and/or
for cleaning a semiconductor substrate, preferably the surface of a semiconductor substrate, comprising a tungsten material and/or a low-k material, preferably after a step of etching one or more substrate layers
wherein the one or more substrate layers which have been etched before are preferably selected from the group consisting of etch mask layers, preferably etch mask layers comprising or consisting of TiN; interlayer dielectric layers and low-k material layers;
and/or
for removing residues and contaminants from the surface of a semiconductor substrate comprising a tungsten material and/or a low-k material,
wherein the residues and contaminants are preferably selected from the group comprising or consisting of:
organic compounds comprising or not comprising fluorine (preferably comprising fluorine),
metal organic complexes and
metallic materials, preferably titanium and/or an oxide of titanium and/or a nitride of titanium.

Generally, all aspects of the present invention discussed herein in the context of the cleaning composition according to the invention, the use of said cleaning composition according to the invention and the first process for the manufacture of a semiconductor device involving the cleaning composition of the present invention apply mutatis mutandis to the use of said cleaning composition in combination with one or more oxidants according to the invention, as defined here above and below. And vice versa, all aspects of the present invention discussed herein in the context of the use of said cleaning composition in combination with one or more oxidants according to the invention apply mutatis mutandis to the cleaning composition according to the invention, the use of said cleaning composition according to the invention and the first process for the manufacture of a semiconductor device involving the cleaning composition of the present invention.

A use of a cleaning composition in combination with one or more oxidants according to the invention as defined herein is preferred, wherein:
the cleaning composition is used in combination with the one or more oxidants in a separate step or simultaneously in the same step, preferably simultaneously in the same step;
and/or
the one or more oxidants are selected from the group consisting of hydrogen peroxide, peroxide urea, peroxydisulfuric acid, ammonium persulfate, peroxymonosulfuric acid, pyrosulfuric acid, ozone and mixtures thereof; and preferably the one or one of the more oxidants is hydrogen peroxide;
and/or
the one or more oxidants, preferably hydrogen peroxide, are used in a total amount in the range of from 0.3 wt.-% to 10.0 wt.-%, preferably in the range of from 0.5 wt.-% to 5.0 wt.-%, more preferably in the range of from 0.6 wt.-% to 4.0 wt.-%, yet more preferably of from 0.75 wt.-% to 3 wt.-% and even yet more preferably in the range of from 0.8 wt.-% to 2.5 wt.-%, based on the total weight of the cleaning composition;
and/or
one or more stabilizers are used in combination with the one or more oxidants and/or in combination with the cleaning composition, preferably selected from the group consisting of amine-N-oxides, preferably N-methylmorpholine-N-oxide and pyridine-N-oxide; citric acid; 1-hydroxyethane 1,1-diphosphonic acid; glycolic acid; lactic acid; hydroxybutyric acid; glyceric acid; malic acid; tartaric acid; malonic acid; succinic acid; glutaric acid; maleic acid and mixtures thereof.

The one or more stabilizers can be used alone or in combination. In the use of a cleaning composition according to the invention, N-methylmorpholine-N-oxide and 1-hydroxyethane 1,1-diphosphonic acid (HEDP) are preferred stabilizers for use in combination with the one or more oxidants and/or in combination with the cleaning composition.

The total amounts in units of "wt.-%" of the one or more oxidants, preferably of hydrogen peroxide, which are specified above and which are used in combination with the cleaning composition of the present invention refer to wt.-% of the pure, undiluted oxidant in each case (e.g. to 100% hydrogen peroxide).

It was particularly surprising that the use of a cleaning composition according to the invention as defined herein (or the use of a cleaning composition according to the invention as described herein as being preferred) in combination with one or more oxidants is particularly suited for the selective oxidative etching, in particular selective partial oxidative etching, of a layer or mask, comprising or consisting of TiN, in the presence of a tungsten material and/or a low-k material, on the surface of a semiconductor substrate. It has been found that said use of said cleaning composition in combination with said one or more oxidants shows or allows an extremely balanced ratio of etch rates for TiN on the one hand, e.g. in a layer or mask, typically an etch-mask, comprising or consisting of TiN, and on the other hand for a conducting metal, in particular tungsten, and for a low k material, which are also present on the surface of the semiconductor substrate. Such balanced ratio allows to very selectively oxidatively etch or to partially oxidatively etch a layer or mask comprising or consisting of TiN in the presence of a tungsten material and/or a low k material and not or only to a very low extent etch or damage the tungsten material and/or the low k material. In particular, the use of said cleaning composition in combination with said one or more oxidants allows to selectively and precisely partially etch a layer or mask comprising or consisting of TiN to a desired extent, i.e. to "pull back" a layer or mask comprising or consisting of TiN to a desired extent in the presence of a tungsten material and/or a low k material and not or only to a very low extent damage the tungsten material and/or the low k material.

Another surprising finding of the present invention was that the above described extremely balanced ratio of etch rates for TiN on the one hand and on the other hand for a conducting metal, in particular tungsten, and/or for a low k material, resulting from the use of said cleaning composition in combination with said one or more oxidants according to the invention is beneficially influenced or controlled by the use of the one or more imidazolidinethiones (D), in particular of 2-imidazolidinethione. Without wishing to be bound by theory it is presently assumed that the one or more imidazolidinethiones, in particular 2-imidazolidinethione, act as specific corrosion inhibitors for a tungsten material in the cleaning composition of the present invention and/or in the wet-etch composition of the present invention.

It has been found in own experiments that a wet-etch composition according to the present invention comprising one or more imidazolidinethiones, in particular 2-imidazolidinethione, as a protective agent or anti-corrosion agent for a tungsten material shows a particularly pronounced selectivity of TiN vs. tungsten etch rates which allows a more selective oxidative etching or partial oxidative etching of a layer or mask comprising or consisting of TiN in the presence of a tungsten material (which shall not or only to a significantly lesser extent be etched) than similar compositions which are known from the prior art and which do not comprise one or more imidazolidinethiones, in particular 2-imidazolidinethione, or which do solely comprise different protective agents or anti-corrosion agents for a tungsten material than the compositions of the present invention.

The present invention therefore also pertains to a wet-etch composition comprising
  (W1) a cleaning composition according to the invention as defined herein (or a cleaning composition according to the invention as described herein as being preferred, i.e. a cleaning composition comprising or consisting of components (A) to (E) as defined above)
and
  (W2) one or more oxidants, preferably selected from the group consisting of hydrogen peroxide, peroxide urea, peroxydisulfuric acid, ammonium persulfate, peroxymonosulfuric acid, pyrosulfuric acid, ozone and mixtures thereof; and more preferably the one or at least one of the more oxidants is hydrogen peroxide,
    preferably in a total amount in the range of from 0.3 wt.-% to 10.0 wt.-%, preferably in the range of from 0.5 wt.-% to 5.0 wt.-%, more preferably in the range of from 0.6 wt.-% to 4.0 wt.-%, yet more preferably of from 0.75 wt.-% to 3 wt.-% and even yet more preferably in the range of from 0.8 wt.-% to 2.5 wt.-%, based on the total weight of the cleaning composition,
preferably for
  oxidative etching or partial oxidative etching of a layer or mask, comprising or consisting of TiN, preferably in the presence of a tungsten material and/or a low-k material, on the surface of a semiconductor substrate;
and/or
  removing post-etch or post-ash residue from the surface of a semiconductor substrate, preferably comprising a tungsten material and/or a low-k material,
    wherein the post-etch or post-ash residue preferably comprises one or more residues selected from the group comprising or consisting of:
      organic compounds comprising or not comprising fluorine,
      metal organic complexes and
      metallic materials, preferably titanium and/or an oxide of titanium and/or a nitride of titanium.

Generally, all aspects of the present invention discussed herein in the context of the cleaning composition according to the invention, the use of said cleaning composition according to the invention, the first process for the manufacture of a semiconductor device involving the cleaning composition of the present invention and the use of said cleaning composition in combination with one or more oxidants according to the invention apply mutatis mutandis to the wet-etch composition according to the invention, as defined here above and below. And vice versa, all aspects of the present invention discussed herein in the context of the wet-etch composition according to the invention apply mutatis mutandis to the cleaning composition according to the invention, to the use of said cleaning composition according to the invention, the first process for the manufacture of a semiconductor device involving the cleaning composition of the present invention and to the use of said cleaning composition in combination with one or more oxidants according to the invention.

The one or more oxidants (W2) may also be present in or added to the wet-etch composition of the invention in the form of an oxidant composition, e.g. an aqueous composition or solution of hydrogen peroxide.

It has been found that the one or more sulfonic acids (A), in particular methane sulfonic acid, as components of the wet-etch composition according to the invention are particularly suited to control the etch rate selectivity for TiN in comparison to tungsten, to stabilize the oxidant (e.g. hydrogen peroxide), and to adjust the pH while at the same time not or only to an acceptably low extent being harmful or damaging to a low k material which is also present.

Preferred is a wet-etch composition according to the invention as defined herein (or a wet-etch composition according to the invention as described above or below as being preferred), which:
  has a pH in the range of from 1 to 4, preferably in the range of from 1 to 3, more preferably in the range of from 1 to 2,
and/or
  further comprises:
  (W3) one or more stabilizers, preferably selected from the group consisting of
    amine-N-oxides, preferably N-methylmorpholine-N-oxide and pyridine-N-oxide;
    citric acid;
    1-hydroxyethane 1,1-diphosphonic acid;
    glycolic acid;
    lactic acid;
    hydroxybutyric acid;
    glyceric acid;
    malic acid;
    tartaric acid;
    malonic acid;
    succinic acid;
    glutaric acid;
    maleic acid and
    mixtures thereof,
  wherein preferably the total amount of the one or more stabilizers present in the wet-etch composition is in the range of from 0.001 wt.-% to 0.5 wt.-%, more preferably in the range of from 0.01 wt.-% to 0.1 wt.-% and yet more preferably in the range of from 0.01 wt.-% to 0.05 wt.-%, based on the total weight of the wet-etch composition.

It has been found that the wet-etch composition of the present invention which has a preferred pH as defined above shows an excellent balance between a low tungsten etch rate (as it is known that tungsten etch rates are lower at lower pH) and a satisfactory activity of the oxidant present which allows for the selective etching of a layer or mask comprising or consisting of TiN in the presence of a tungsten material and/or a low k material as described herein.

The present invention further pertains to the use of a wet-etch composition according to the invention as defined herein (or a wet-etch composition according to the invention as described above or below as being preferred), for oxidative etching or partially oxidative etching of a layer or mask, comprising or consisting of TiN, preferably in the presence of a tungsten material and/or a low-k material, on the surface of a semiconductor substrate;

and/or for removing or partially removing a layer or mask, comprising or consisting of TiN, preferably in the presence of a tungsten material and/or a low-k material, on the surface of a semiconductor substrate;

and/or for recessing a layer or mask, comprising or consisting of TiN, preferably in the presence of a tungsten material and/or a low-k material, on the surface of a semiconductor substrate;

and/or for pulling back a layer or mask, comprising or consisting of TiN, preferably in the presence of a tungsten material and/or a low-k material, on the surface of a semiconductor substrate;

and/or for removing post-etch or post-ash residue from the surface of a semiconductor substrate, preferably comprising a tungsten material and/or a low-k material,
wherein the post-etch or post-ash residue preferably comprises one or more residues selected from the group comprising or consisting of:
organic compounds, preferably organic polymers, comprising or not comprising fluorine (preferably comprising fluorine),
metal organic complexes and
metallic materials, preferably titanium and/or an oxide of titanium and/or a nitride of titanium, and/or for cleaning a semiconductor substrate, preferably the surface of a semiconductor substrate, comprising a tungsten material and/or a low-k material, preferably after a step of etching one or more substrate layers
wherein the one or more substrate layers which have been etched before are preferably selected from the group consisting of etch mask layers, preferably etch mask layers comprising or consisting of TiN; interlayer dielectric layers and low-k material layers;

and/or for removing residues and contaminants from the surface of a semiconductor substrate comprising a tungsten material and/or a low-k material,
wherein the residues and contaminants are preferably selected from the group comprising or consisting of:
organic compounds comprising or not comprising fluorine (preferably comprising fluorine),
metal organic complexes and
metallic materials, preferably titanium and/or an oxide of titanium and/or a nitride of titanium.

Generally, all aspects of the present invention discussed herein in the context of the cleaning composition according to the invention, the use of said cleaning composition according to the invention, the first process for the manufacture of a semiconductor device involving the cleaning composition of the present invention, the use of said cleaning composition in combination with one or more oxidants according to the invention and the wet-etch composition according to the invention apply mutatis mutandis to the use of the wet-etch composition according to the invention, as defined herein. And vice versa, all aspects of the present invention discussed herein in the context of the use of the wet-etch composition according to the invention apply mutatis mutandis to the cleaning composition according to the invention, to the use of said cleaning composition according to the invention, to the first process for the manufacture of a semiconductor device involving the cleaning composition of the present invention, to the use of said cleaning composition in combination with one or more oxidants according to the invention and to the wet-etch composition according to the invention.

It has been found that the wet-etch composition of the present invention is excellently suited to on the one hand oxidatively etch, in particular selectively and/or partially oxidatively etch a layer or mask comprising or consisting of TiN in the presence of a tungsten material and/or a low k material (where tungsten material and/or the low k material should not or only to the least possible extent be etched or damaged) while on the other hand remove post-etch or post-ash residue from the surface of a semiconductor substrate, as defined above.

The present invention also pertains to a second process for the manufacture of a semiconductor device from a semiconductor substrate, comprising the following steps:

mixing a cleaning composition according to the invention as defined herein (or a cleaning composition according to the invention as described herein as being preferred) with one or more oxidants, preferably selected from the group consisting of hydrogen peroxide, peroxide urea, peroxydisulfuric acid, ammonium persulfate, peroxymonosulfuric acid, pyrosulfuric acid, ozone and mixtures thereof; and more preferably the one or one of the more oxidants is hydrogen peroxide,
so as to receive a wet-etch composition, or providing a wet-etch composition as defined above (or a wet-etch composition as defined above as being preferred)

and contacting at least once with the wet-etch composition so received or provided a layer or mask, comprising or consisting of TiN, preferably in the presence of a tungsten material and/or a low-k material, on the surface of a semiconductor substrate,
so as
to selectively oxidatively etch or partially oxidatively etch said layer or mask
and/or
to remove post-etch or post-ash residue from the surface of said semiconductor substrate,
wherein the post-etch or post-ash residue preferably comprises one or more residues selected from the group comprising or consisting of:
organic compounds, preferably organic polymers, comprising or not comprising fluorine (preferably comprising fluorine),
metal organic complexes and
metallic materials, preferably titanium and/or an oxide of titanium and/or a nitride of titanium, and preferably performing additional subsequent steps so as to receive a semiconductor device.

Generally, all aspects of the present invention discussed herein in the context of the cleaning composition according to the invention, the use of said cleaning composition according to the invention, the first process for the manufacture of a semiconductor device involving the cleaning composition of the present invention the use of said cleaning composition in combination with one or more oxidants according to the invention, the wet-etch composition according to the invention and the use of the wet-etch composition according to the invention apply mutatis mutandis to the second process for the manufacture of a semiconductor device according to the invention, as defined herein. And vice versa, all aspects of the present invention discussed herein in the context of the second process for the manufacture of a semiconductor device according to the invention apply mutatis mutandis to the cleaning composition according to the invention, to the use of said cleaning composition according to the invention, to the first process for the manufacture of a semiconductor device involving the cleaning composition of the present invention, to the use of said cleaning composition in combination with one or more oxidants according to the invention, to the wet-etch composition according to the invention and to the use of the wet-etch composition according to the invention.

In a preferred variant of the second process for the manufacture of a semiconductor device according to the invention, the mixing of the cleaning composition with the one or more oxidants to receive the wet-etch composition of the present invention is done prior to contacting with the wet-etch composition according to the invention the layer or mask, comprising or consisting of TiN. In one preferred variant of the present invention mixing of the cleaning composition with the one or more oxidants for preparing the wet-etch composition according to the invention is done immediately or directly before contacting with the wet-etch composition so received the layer or mask, comprising or consisting of TiN.

In a variant of the second process for the manufacture of a semiconductor device according to the invention, the mixing of the cleaning composition with the one or more oxidants to receive the wet-etch composition of the present invention is done in one or more tools for processing a semiconductor substrate for manufacturing a semiconductor device, preferably at a suitable process temperature.

A second process for the manufacture of a semiconductor device from a semiconductor substrate according to the invention is therefore preferred wherein the step of contacting with the wet-etch composition a layer or mask, comprising or consisting of TiN, is conducted at a temperature in the range of from 25 to 65° C., preferably in the range of from 30 to 60° C. and more preferably in the range of from 35 to 58° C.

Under a particularly preferred aspect of the present invention, the wet-etch composition according to the invention (or a wet-etch composition according to the invention as described herein as being preferred) is suitable and intended for the use or application in the second process for the manufacture of a semiconductor device from a semiconductor substrate as defined above.

In a more specific aspect, the present invention also pertains to a kit,
preferably for post-etch or post-ash residue removal from the surface of a semiconductor substrate and/or for oxidative etching or partially oxidative etching of a layer or mask, comprising or consisting of TiN, preferably in the presence of a tungsten material and/or a low-k material, on the surface of a semiconductor substrate,
comprising as separate components:
(K1) a cleaning composition according to the invention as defined herein (or a cleaning composition according to the invention as described herein as being preferred, i.e. a cleaning composition comprising or consisting of components (A) to (E) as defined above);
and
(K2) one or more oxidants, preferably selected from the group consisting of hydrogen peroxide, peroxide urea, peroxydisulfuric acid, ammonium persulfate, peroxymonosulfuric acid, pyrosulfuric acid, ozone and mixtures thereof; more preferably the one or one of the more oxidants is hydrogen peroxide;
and further optionally comprising, as separate component or combined with component (K1) and/or with component (K2):
(K3) one or more stabilizers, preferably selected from the group consisting of amine-N-oxides, preferably N-methylmorpholine-N-oxide and pyridine-N-oxide; citric acid; 1-hydroxyethane 1,1-diphosphonic acid; glycolic acid; lactic acid; hydroxybutyric acid; glyceric acid; malic acid; tartaric acid; malonic acid; succinic acid; glutaric acid; maleic acid and mixtures thereof.

Generally, all aspects of the present invention discussed herein in the context of the cleaning composition according to the invention, the use of said cleaning composition according to the invention, the first process for the manufacture of a semiconductor device involving the cleaning composition of the present invention, the use of said cleaning composition in combination with one or more oxidants according to the invention, the wet-etch composition according to the invention, the use of the wet-etch composition according to the invention and the second process for the manufacture of a semiconductor device according to the invention apply mutatis mutandis to the kit according to the invention, as defined herein. And vice versa, all aspects of the present invention discussed herein in the context of the kit according to the invention apply mutatis mutandis to the cleaning composition according to the invention, to the use of said cleaning composition according to the invention, to the first process for the manufacture of a semiconductor device involving the cleaning composition of the present invention, to the use of said cleaning composition in combination with one or more oxidants according to the invention, to the wet-etch composition according to the invention, to the use of the wet-etch composition according to the invention and to the second process for the manufacture of a semiconductor device according to the invention.

Under a particularly preferred aspect of the present invention, the kit according to the invention is suitable and intended for the preparation of a respective wet-etch composition according to the invention, as defined above.

Under another particularly preferred aspect of the present invention the kit according to the invention and the wet-etch composition prepared from it are suitable and intended for the use or application in the second process for the manufacture of a semiconductor device from a semiconductor substrate according to the invention as defined above.

The one or more oxidants (K2) can be used alone or in combination with each other. The one or more oxidants may also be present in the kit of the invention in the form of an oxidant composition, e.g. an aqueous composition or solution of hydrogen peroxide.

Under another aspect, the present invention also pertains to the use of an imidazolidinethione, preferably of 2-imidazolidinethione, in a composition for etching or partially etching of a layer or mask in the presence of a tungsten material and/or a low-k material, on the surface of a semiconductor substrate and/or for cleaning a semiconductor substrate, wherein preferably
the use is as corrosion inhibitor or protective agent,
and/or
the cleaning comprises post-etch or post-ash residue removal from the surface of a semiconductor substrate, and/or
the layer or mask comprises or consists of TiN
and/or
the composition comprises one or more oxidants.

Generally, all aspects of the present invention discussed herein in the context of the cleaning composition according to the invention, the use of said cleaning composition according to the invention, the first process for the manufacture of a semiconductor device involving the cleaning composition of the present invention the use of said cleaning composition in combination with one or more oxidants according to the invention, the wet-etch composition according to the invention, the use of the wet-etch composition according to the invention, the second process for the manufacture of a semiconductor device according to the invention and the kit according to the invention apply mutatis mutandis to the use of 2-imidazolidinethione in a composition for etching or partially etching of a layer or mask and/or for cleaning a semiconductor substrate according to the invention, as defined herein. And vice versa, all aspects of the present invention discussed herein in the context of the use of 2-imidazolidinethione in a composition for etching or partially etching of a layer or mask and/or for cleaning a semiconductor substrate apply mutatis mutandis to the cleaning composition according to the invention, to the use of said cleaning composition according to the invention, to the first process for the manufacture of a semiconductor device involving the cleaning composition of the present invention, to the use of said cleaning composition in combination with one or more oxidants according to the invention, to the wet-etch composition according to the invention, to the use of the wet-etch composition according to the invention and to the second process for the manufacture of a semiconductor device according to the invention.

EXAMPLES

The following examples are meant to further explain the invention without limiting its scope.

The following abbreviations are used in the examples section:
2-IMT: 2-imidazolidinethione (CAS RN 96-45-7)
2-IAD: 2-imidazolidinone hemihydrate (CAS RN 121325-67-5)
MSA: methyl sulfonic acid
BDG: butyl diglycol
DMSO: dimethyl sulfoxide
TMAF: tetramethyl ammonium fluoride
TMAH: tetramethyl ammonium hydroxide
EDTMPA: ethylenediamine tetra(methylene phosphonic acid)
DMU: dimethylol urea (CAS RN 140-954)
n.a.: no data available
n.d.: not determined Example 1: Preparation of Cleaning Compositions According to the Invention and of Comparative Cleaning Compositions (not According to the Invention)

The following cleaning compositions according to the invention (CCI1 to CCI7) were prepared by mixing the components (A) to (X) in each case. Details are given below in table 1. The indication of components (A) to (F) corresponds to the indication of components as defined above. Components identified by "(X)" are components which are not comprised by any of the definitions of components (A) to (F).

TABLE 1

Cleaning compositions according to the invention

| Component | Constituent | Composition [wt.-%] | | | | | | |
|---|---|---|---|---|---|---|---|---|
| | | CCI1 | CCI2 | CCI3 | CCI4 | CCI5 | CCI6 | CCI7 |
| (A) | MSA | 0.3 | 0.3 | 0.3 | 0.3 | 0.3 | 0.3 | 0.3 |
| (B) | Sulfolane | 10.0 | 10.0 | 10.0 | 10.0 | 10.0 | 10.0 | 10.0 |
| (C) | BDG | 30.0 | 30.0 | 30.0 | 35.0 | 35.0 | 25.0 | 25.0 |
| (D) | 2-IMT | 0.6 | 0.9 | 0.6 | 0.9 | 0.9 | 0.9 | 0.9 |
| (E) | Water | 59.1 | 58.8 | 59.09 | 52.45 | 51.55 | 61.55 | 61.1 |
| (F) | 2-IAD | 0 | 0 | 0 | 1.35 | 2.25 | 2.25 | 2.7 |
| (X) | TMAF | 0 | 0 | 0.01 | 0 | 0 | 0 | 0 |

In addition, comparative cleaning compositions (not according to the invention, i.e. compositions CCC1 to CCC3) were also prepared in a similar manner, as shown in more detail in table 2 below.

TABLE 2

Comparative cleaning compositions (not according to the invention)

| Component | Constituent | Composition [wt.-%] | | |
|---|---|---|---|---|
| | | CCC1 | CCC2 | CCC3 |
| (A) | MSA | 0.3 | 0.3 | 0.1 |
| (B) | Sulfolane | 10.0 | 10.0 | 0 |
| (B) | DMSO | 0 | 0 | 25.0 |
| (C) | BDG | 30.0 | 30.0 | 35.0 |
| (E) | Water | 57.9 | 59.1 | 37.2 |
| (F) | 2-IAD | 0 | 0 | 2.7 |
| (X) | DMU | 0 | 0.6 | 0 |
| (X) | TMAH | 0.8 | 0 | 0 |
| (X) | EDTMPA | 1.0 | 0 | 0 |

Example 2: Preparation of Wet-Etch Compositions According to the Invention and of Comparative Wet-Etch Compositions (not According to the Invention)

The following wet-etch compositions according to the invention (WEI1a to WEI7) were prepared by mixing the cleaning compositions of the invention CCI1 to CCI7 (see Example 1) in each case with hydrogen peroxide ($H_2O_2$, 30 wt.-% in water) in a sufficient amount to receive the final concentrations or weight ratios as shown in table 3 below, where the "wt.-% $H_2O_2$" in each case is given in relation to the total weight of the respective cleaning composition (CCI1 to CCI7) utilized for preparing a certain wet-etch composition and where the "wt.-% $H_2O_2$" in each case represents the amount or concentration of pure (undiluted) hydrogen peroxide present in the respective wet-etch composition.

TABLE 3

Wet-etch compositions according to the invention

| | Wet-etch Composition of the Invention | | | | | | | |
|---|---|---|---|---|---|---|---|---|
| | WEI1a | WEI1b | WEI2 | WEI3 | WEI4 | WEI5 | WEI6 | WEI7 |
| Cleaning composition: | CCI1 | CCI1 | CCI2 | CCI3 | CCI4 | CCI5 | CCI6 | CCI7 |
| $H_2O_2$ (pure, undiluted) [wt.-%]/ cleaning composition | 1.50 | 1.25 | 1.50 | 1.00 | 1.50 | 1.50 | 1.50 | 1.50 |
| pH: | 1.37 | 1.32 | 1.34 | 1.36 | n.a. | n.a. | n.a. | n.a. |

In addition, comparative wet-etch compositions (not according to the invention, i.e. compositions WEC1 to WEC3) were also prepared in a similar manner, as shown in more detail in table 4 below.

TABLE 4

Comparative wet-etch compositions (not according to the invention)

| | Comparative Wet-etch Composition | | |
|---|---|---|---|
| | WEC1 | WEC2 | WEC3 |
| Cleaning composition: | CCC1 | CCC2 | CCC3 |
| $H_2O_2$ [wt.-%]/cleaning composition | 1.50 | 1.50 | 1.50 |
| pH: | 4.94 | 1.4 | n.a. |

Example 3: Measurement of Etch Rates—Part 1

The etch rates on layers of tungsten and TiN of wet-etch compositions of the invention from Example 2 were determined according or analogous to methods described in document WO 2015/173730 A1. The wet-etch compositions were prepared by mixing the respective cleaning composition with the specified amount of hydrogen peroxide immediately before the etch-rate experiments were performed.

Si test wafers with layers of tungsten or TiN were selected from appropriate commercial sources and broken into smaller coupons. The layer thickness and etch rates were then measured by X-ray fluorescence analysis (XRF) in a manner known per se. XRF is suitable for the non-contact and non-destructive thickness measurement of thin layers as well as for determining their chemical composition. For this type of measurement, the X-ray source and detector are located on the same side of a sample. When the layer on the substrate is subjected to X-rays, the radiation will penetrate the layer, if it is sufficiently thin, to a certain extent, depending on the thickness, and in turn cause characteristic fluorescence radiation in the material of the underlying substrate. On its way to the detector, this fluorescence radiation will be attenuated by absorption at the layer. The thickness of the layer can be determined based on the intensity attenuation of the fluorescence radiation of the substrate material.

For determining the initial film or layer thickness of the applicable material, an XRF recipe was created for the pristine wafers, based on reported layer thickness from the supplier and verified with transmission electron microscopy (TEM) cross-section.

The wet-etch compositions were then brought to the test temperature (as specified in table 5 below) and stirred mechanically. The wafer coupons were fixed to a mechanical holder and were contacted with the wet-etch compositions for about 10 minutes in a beaker. Subsequently, the coupons were withdrawn from the wet-etch compositions and cleaned with ultra-pure water or with isopropyl alcohol or with a mixture of ultra-pure water and isopropyl alcohol, for a period of about 1 minute. Afterwards, the coupons were dried with nitrogen gas. The residual thickness of the layers (tungsten or TiN) after etching was measured again as described above and the etch rate was calculated as usual in each case:

For example, when the initial thickness of the tungsten layer on the test wafer was 33 nm and the thickness of the tungsten layer on the test wafer after contact with the test composition (i.e. a wet-etch composition according to the invention or a comparative wet-etch composition) was 30 nm, and the reaction time (i.e. contact time of the wafer coupon with the test composition) was 10 min, the tungsten etch rate was calculated as follows:

Tungsten Etch Rate (hypothetical)=(33−30)/10·nm/min=0.3 nm/min

The results from this test are shown in table 5 below.

TABLE 5

Results from etch rate tests with wet-etch compositions according to the invention

| | Wet-etch Composition | | | |
|---|---|---|---|---|
| | WEI1a | WEI1b | WEI2 | WEI3 |
| Temperature [° C.] | 55 | 55 | 55 | 55 |
| Etch rate TiN [nm/min] | 0.625 | 0.4 | 0.56 | 0.325 |
| Etch rate W [nm/min] | 0.68 | 0.46 | 0.36 | 0.41 |
| Etch rate ratio W/TiN | 1.09 | 1.15 | 0.64 | 1.26 |

From the results in table 5 it can be seen that an increased amount of 2-imidazolidinethione (in wet-etch composition WEI2 when compared to WEI1a) leads to improved protection of tungsten against etching while the etch rate for TiN is less influenced. In effect, the etch rate ratio of W/TiN is therefore decreased which allows a more selective etching of TiN in the presence of tungsten. A mere increase in oxidant (hydrogen peroxide) does not allow selective etching of TiN in the presence of tungsten (cf. composition WEI1a vs. WEI1b). Wet-etch composition WEI2 showed the best etch rate ratio W/TiN of all wet-etch compositions tested and is thus most suitable for selectively etching a layer or mask comprising or consisting of TiN, in the presence of a tungsten material, whereby the tungsten material shall not or only to the least possible extent be etched or damaged.

In addition, etch rates on tungsten and TiN were determined in a similar manner as described above of comparative wet-etch compositions WEC1 and WEC2 (not according to the invention) from Example 2 (test temperatures were as specified in table 6 below). The results from this test are shown in table 6 below.

TABLE 6

Results from etch rate tests with comparative wet-etch compositions (not according to the invention)

| | Wet-etch Composition | |
|---|---|---|
| | WEC1 | WEC2 |
| Temperature [° C.] | 60 | 50 |
| Etch rate TiN [nm/min] | 0 | 0.52 |
| Etch rate W [nm/min] | 0.12 | 0.83 |
| Etch rate ratio W/TiN | n.d. | 1.59 |

From the results in table 6 it can be seen that the comparative wet-etch compositions with alternative corrosion inhibitors or protective agents were not suited, or were not as well suited as the wet-etch compositions of the present invention, for improving the W/TiN etch rate ratio in order to allow higher etch rates for TiN while at the same time only to a very low extent damage a tungsten material which is also present.

Example 4: Measurement of Etch Rates—Part 2

In a similar experiment as explained in Example 3, etch rates on layers of tungsten and TiN of wet-etch compositions of the invention from Example 2 and of comparative wet-etch compositions (not according to the invention) from Example 2 were determined according or analogous to the method described above in Example 3, but on a different set of Si wafers from another commercial supply source.

For better comparability, etch rate ratios for W/TiN etch rates were determined in each case and shown in relation to the W/TiN-etch rate ratio of comparative wet-etch composition WEC3, which is of a type known from the prior art. The W/TiN-etch rate ratio for comparative wet-etch composition WEC3 is thus set (normalized) to "1" for the purpose of displaying the results from the test method of this Example 4. All tests of this Example 4 were performed at a temperature of 55° C. The results of this test are shown in table 7 below.

TABLE 7

Results from etch rate tests with wet-etch compositions according to the invention and with a comparative wet-etch composition (not according to the invention)

| | Wet-etch Composition | | | | | |
|---|---|---|---|---|---|---|
| | WEC3 | WEI2 | WEI4 | WEI5 | WEI6 | WEI7 |
| Etch rate ratio W/TiN:W/TiN (WEC3) | 1.0 | 0.29 | 0.55 | 0.63 | 0.35 | 0.35 |

From the results in table 7 it can be seen that all wet-etch compositions of the invention showed a better etch rate selectivity for TiN in relation to tungsten, i.e. the etch rate ratios W/TiN of all wet-etch compositions of the invention were lower than the etch rate ratio of the comparative wet-etch composition of the prior art, allowing to perform with the wet-etch compositions of the present invention a more selective etching of a layer or mask comprising or consisting of TiN, in the presence of a tungsten material, whereby the tungsten material shall not or only to the least possible extent be etched or damaged. Wet-etch composition WEI2 showed the best etch rate ratio W/TiN of all wet-etch compositions tested.

Moreover, it can be seen from the data in table 7 that the use of 2-imidazolidinethione alone in a wet-etch composition has a stronger protective effect on a tungsten material (cf. wet-etch composition WEI2) vs. a TiN material than 2-imidazolidinone alone (cf. comparative composition WEC3) or even than a mixture of 2-imidazolidinethione and 2-imidazolidinone (cf. compositions WEI4 to WEI7). Increasing amounts of 2-imidazolidinone can improve the W/TiN etch rate ratio to some extent but only to a threshold value which is not increased further (cf. compositions WEI6 and WEI7) by higher amounts of 2-imidazolidinone. Said threshold value is still higher than the respective value for a composition which uses 2-imidazolidinethione alone, i.e. a wet-etch composition comprising 2-imidazolidinethione alone (i.e. as only corrosion inhibitor or protective agent) has a more selective etch rate for TiN vs. W than a composition not comprising 2-imidazolidinethione but only alternative corrosion inhibitors or protective agents. A wet-etch composition comprising 2-imidazolidinethione alone (i.e. as only corrosion inhibitor or protective agent) also has a more selective etch rate for TiN vs. W than a composition comprising 2-imidazolidinethione in combination with other/alternative corrosion inhibitors or protective agents. The reason for this finding may be that the alternative corrosion inhibitors or protective agents (as used in e.g. wet-etch compositions WEI3 to WEI7) have a stronger (and undesired) suppressing effect on the TiN-etch rate of a composition than an imidazolidinethione, specifically than 2-imidazolidinethione.

The invention claimed is:

1. A cleaning composition for post-etch or post-ash residue removal from the surface of a semiconductor substrate, comprising:
   one or more sulfonic acids, selected from the group consisting of methane sulfonic acid, ethanesulfonic acid, propanesulfonic acid, butanesulfonic acid, hexanesulfonic acid, 3-(N-morpholino)propane sulfonic acid, 2-(N-morpholino)ethanesulfonic acid, N-cyclohexyl-2-aminoethanesulfonic acid, 3-[4-(2-hydroxyethyl)-1-piperazinyl] propanesulfonic acid, N-cyclohexyl-3-aminopropanesulfonic acid, and mixtures thereof;
   one or more polar, non-protogenic organic solvents, selected from the group consisting of dimethyl formamide, dimethyl sulfoxide, dimethylacetamide, N-methylpyrrolidone, propylene carbonate, sulfolane, tetrahydrofuran, and mixtures thereof,
   one or more glycol ethers, selected from the group consisting of 1,1-dimethoxyethane, 1-methoxy-2-butanol, 2-(2-butoxyethoxy) ethanol, 2-(naphthalene-6-yloxy) polyethoxyethanol, 2-(hexyloxy)ethanol, 2-methoxy-1-butanol, 2-methoxy-2-methylbutanol, butyl diglycol, diethylene glycol diethyl ether, diethylene glycol dimethyl ether, diethylene glycol methyl ethyl ether, diethylene glycol monobenzyl ether, diethylene glycol monobutyl ether, diethylene glycol monoethyl ether, diethylene glycol monoisobutyl ether, diethylene glycol monoisopropyl ether, diethylene glycol monomethyl ether, diethylene glycol monopropyl ether, dipropylene glycol diisopropyl ether, dipropylene glycol monoisopropyl ether, dipropylene glycol monomethyl ether, dipropylene glycol monopropyl ether, dipropylenemonobutyl ether, ethylene glycol diethyl ether, ethylene glycol dimethyl ether, ethylene glycol monobutyl ether, ethylene glycol monoethyl ether acetate, ethylene glycol monoethyl ether, ethylene glycol monomethyl ether, monopropyl ether, polyethylene glycol monomethyl ether, propylene glycol dimethyl ether, propylene glycol monobutyl ether, propylene glycol monomethyl ether, propylene glycol, tetrahydrofurfurylalcohol, triethylene glycol dimethyl ether, triethylene glycol ethylene glycol monomethyl ether acetate, triethylene glycol monomethyl ether, tripropylene glycol monomethyl ether, and mixtures thereof, one or more imidazolidinethiones, and water.

2. The cleaning composition of claim 1, wherein
the one or more sulfonic acids is methane sulfonic acid,
and/or
the total amount of the one or more sulfonic acids is in the range of from 0.01 wt.-% to 10 wt.-%, based on the total weight of the cleaning composition.

3. The cleaning composition of claim 1, wherein
the one or more polar, non-protogenic organic solvents is sulfolane,
and/or
the total amount of the one or more polar, non-protogenic organic solvents is in the range of from 1 wt.-% to 25 wt.-%, based on the total weight of the cleaning composition.

4. The cleaning composition of claim 1, wherein
the one or more glycol ethers is butyl diglycol,
and/or
the total amount of the one or more glycol ethers is in the range of from 10 wt.-% to 50 wt.-%, based on the total weight of the cleaning composition.

5. The cleaning composition of claim 1, wherein
the one or more imidazolidinethiones is 2-imidazolidinethione,
and/or
the total amount of the one or more imidazolidinethiones is in the range of from 0.05 wt.-% to 10 wt.-%, based on the total weight of the cleaning composition.

6. The cleaning composition of claim 1, comprising wherein:
the one or more sulfonic acids is methane sulfonic acid,
the one or more polar, non-protogenic organic solvents is sulfolane,
the one or more glycol ethers is butyl diglycol, and
the one or more imidazolidinethiones is 2-imidazolidinethione.

7. A method of cleaning with the cleaning composition of claim 1, comprising:
contacting a surface of a semiconductor substrate to remove a post-etch or post-ash residue from the surface of the semiconductor substrate;
and/or
contacting a semiconductor substrate comprising a tungsten material and/or a low-k material to clean the semiconductor substrate;
and/or
contacting a surface of a semiconductor substrate comprising a tungsten material and/or a low-k material to remove a residue or a contaminant.

8. The method of claim 7, wherein the cleaning composition is used in combination with one or more oxidants, and the method further comprises:
oxidative etching or partially oxidative etching of a layer or mask, comprising TiN, on the surface of the semiconductor substrate;
and/or
removing or partially removing a layer or mask, comprising TiN, on the surface of the semiconductor substrate;
and/or
recessing a layer or mask, comprising TiN, on the surface of the semiconductor substrate;
and/or
pulling back a layer or mask, comprising TiN, on the surface of the semiconductor substrate;
and/or
removing post-etch or post-ash residue from the surface of the semiconductor substrate.

9. The method of claim 8, wherein:
the cleaning composition is used in combination with the one or more oxidants in a separate step or simultaneously in the same step;
and/or
the one or more oxidants are selected from the group consisting of hydrogen peroxide, peroxide urea, peroxydisulfuric acid, ammonium persulfate, peroxymonosulfuric acid, pyrosulfuric acid, ozone, and mixtures thereof;
and/or
the one or more oxidants are used in a total amount in the range of from 0.3 wt-% to 10.0 wt.-% based on the total weight of the cleaning composition;
and/or
one or more stabilizers are used in combination with the one or more oxidants and/or in combination with the cleaning composition.

10. A wet-etch composition, comprising:
the cleaning composition of claim 1,
and
one or more oxidants.

11. The wet-etch composition of claim 10,
which has a pH in the range of from 1 to 4;
and/or
wherein the wet-etch composition further comprises one or more stabilizers.

12. A method of cleaning with the wet-etch composition of claim 10, comprising:
contacting a surface of a semiconductor substrate with the wet-etch composition for oxidative etching or partially oxidative etching of a layer or mask, comprising TiN, on the surface of the semiconductor substrate;
and/or
contacting a surface of a semiconductor substrate with the wet-etch composition for removing or partially removing a layer or mask, comprising TiN, on the surface of the semiconductor substrate;
and/or
contacting a surface of a semiconductor substrate with the wet-etch composition for recessing a layer or mask, comprising TiN, on the surface of the semiconductor substrate;
and/or
contacting a surface of a semiconductor substrate with the wet-etch composition for pulling back a layer or mask, comprising TiN, on the surface of the semiconductor substrate;
and/or
contacting a surface of a semiconductor substrate with the wet-etch composition for removing post-etch or post-ash residue from the surface of the semiconductor substrate;

and/or contacting a surface of a semiconductor substrate with the wet-etch composition, the semiconductor substrate comprising a tungsten material and/or a low-k material; and/or contacting a surface of a semiconductor substrate with the wet-etch composition for removing residues and contaminants from the surface of the semiconductor substrate, the semiconductor substrate comprising a tungsten material and/or a low-k material.

13. A process for manufacturing a semiconductor device from a semiconductor substrate, comprising:

contacting a layer or mask comprising TiN on a surface of the semiconductor substrate at least once with the wet-etch composition according to claim 10, wherein the contacting selectively oxidatively etches or partially oxidatively etches the layer or mask and/or removes a post-etch or a post-ash residue from the surface of the semiconductor substrate.

14. A process for manufacturing a semiconductor device from a semiconductor substrate, comprising:

mixing a cleaning composition according to claim 1 with one or more oxidants to form a wet-etch composition, and contacting a layer or mask comprising TiN on a surface of the semiconductor substrate at least once with the wet-etch composition, wherein the contacting selectively oxidatively etches or partially oxidatively etches the layer or mask and/or removes a post-etch or a post-ash residue from the surface of the semiconductor substrate.

15. A kit, comprising as separate components:

a cleaning composition according to claim 1;

and one or more oxidants;

wherein the kit optionally further comprises, as a separate component or combined with the cleaning composition and/or with the one or more oxidants:

one or more stabilizers.

* * * * *